United States Patent
Park et al.

(10) Patent No.: US 10,739,677 B2
(45) Date of Patent: Aug. 11, 2020

(54) PHOTOSENSITIVE COLORED INK COMPOSITION FOR BEZEL, BEZEL PATTERN FORMED BY USING SAME, AND DISPLAY SUBSTRATE CONTAINING SAME

(71) Applicant: LG CHEM, LTD., Seoul (KR)

(72) Inventors: Sung-Eun Park, Daejeon (KR); Yong-Sung Goo, Daejeon (KR); Seung-A Back, Daejeon (KR); Joon-Hyung Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/518,951

(22) PCT Filed: Dec. 11, 2015

(86) PCT No.: PCT/KR2015/013631
§ 371 (c)(1),
(2) Date: Apr. 13, 2017

(87) PCT Pub. No.: WO2016/093672
PCT Pub. Date: Jun. 16, 2016

(65) Prior Publication Data
US 2017/0227844 A1    Aug. 10, 2017

(30) Foreign Application Priority Data

Dec. 11, 2014  (KR) .......... 10-2014-0178523
Dec. 10, 2015  (KR) .......... 10-2015-0175947

(51) Int. Cl.
G03F 7/027    (2006.01)
G03F 7/004    (2006.01)
(Continued)

(52) U.S. Cl.
CPC ............... *G03F 7/004* (2013.01); *C07F 7/02* (2013.01); *C07F 7/081* (2013.01); *C08F 4/02* (2013.01);
(Continued)

(58) Field of Classification Search
CPC .......... G03F 7/004; G03F 7/029; G03F 7/027; C08L 63/00; C07F 7/081; C07F 7/02;
(Continued)

(56) References Cited

U.S. PATENT DOCUMENTS 6,959,986 B2    11/2005  Ushirogouchi et al.
7,108,367 B2    9/2006   Ushirogouchi et al.
(Continued)

FOREIGN PATENT DOCUMENTS

CN    1354763 A    6/2002
CN    1486349 A    3/2004
(Continued)

OTHER PUBLICATIONS

Watanabe, machine English translation of JP 2010-013596 (Year: 2010).*

(Continued)

*Primary Examiner* — Jessica M Roswell
(74) *Attorney, Agent, or Firm* — Dentons US LLP

(57) ABSTRACT

This invention relates to a photosensitive color ink composition for a bezel, including (A) a cationic polymerizable alicyclic epoxy monomer, (B) a cationic polymerizable aliphatic epoxy monomer, (C) an oxetane monomer, (D) a photopolymerization initiator, and (E) a colorant, and to a bezel pattern formed using the same.

13 Claims, 1 Drawing Sheet

(51) Int. Cl.
| | |
|---|---|
| *G03F 7/029* | (2006.01) |
| *C08G 65/18* | (2006.01) |
| *C08L 63/00* | (2006.01) |
| *C08G 65/22* | (2006.01) |
| *C09D 11/101* | (2014.01) |
| *G03F 7/038* | (2006.01) |
| *G03F 7/00* | (2006.01) |
| *C07F 7/02* | (2006.01) |
| *C07F 7/08* | (2006.01) |
| *C08F 4/02* | (2006.01) |
| *C08G 59/32* | (2006.01) |
| *C08K 5/11* | (2006.01) |
| *C08K 5/54* | (2006.01) |
| *C08K 5/5435* | (2006.01) |
| *C08K 5/544* | (2006.01) |

(52) U.S. Cl.
CPC ............ *C08G 59/32* (2013.01); *C08G 65/18* (2013.01); *C08G 65/226* (2013.01); *C08K 5/11* (2013.01); *C08K 5/54* (2013.01); *C08L 63/00* (2013.01); *C09D 11/101* (2013.01); *G03F 7/0007* (2013.01); *G03F 7/027* (2013.01); *G03F 7/029* (2013.01); *G03F 7/038* (2013.01); *C08K 5/544* (2013.01); *C08K 5/5435* (2013.01)

(58) Field of Classification Search
CPC ...... C08G 65/18; C08G 59/32; C09D 11/101; C08K 5/11; C08K 5/54; C08K 5/544; C08K 5/5435; C08F 4/02
See application file for complete search history.

(56) References Cited

U.S. PATENT DOCUMENTS

| | | | |
|---|---|---|---|
| 7,125,112 B2 | 10/2006 | Ushirogouchi et al. | |
| 7,387,380 B2 | 6/2008 | Ushirogouchi et al. | |
| 7,473,718 B2 | 1/2009 | Ishikawa | |
| 7,500,745 B2 | 3/2009 | Ushirogouchi et al. | |
| 8,526,765 B2 | 9/2013 | Sakaguchi et al. | |
| 2002/0132872 A1* | 9/2002 | Yamamura | C08F 255/00 522/15 |
| 2003/0149127 A1* | 8/2003 | Jansen | C03C 25/106 522/178 |
| 2003/0215196 A1 | 11/2003 | Bulters et al. | |
| 2003/0231234 A1* | 12/2003 | Ushirogouchi | B41J 2/0057 347/100 |
| 2004/0241578 A1 | 12/2004 | Hirai | |
| 2005/0171255 A1 | 8/2005 | Yamamura et al. | |
| 2005/0187310 A1 | 8/2005 | Jansen et al. | |
| 2007/0043138 A1 | 2/2007 | Yamamura et al. | |
| 2007/0208106 A1* | 9/2007 | Chen | C08G 59/18 523/137 |
| 2010/0068407 A1* | 3/2010 | Jeremic | C09D 11/101 427/511 |
| 2010/0079568 A1* | 4/2010 | Miura | B41M 5/0023 347/102 |
| 2011/0165387 A1 | 7/2011 | Kondo | |
| 2014/0176823 A1 | 6/2014 | Jeon et al. | |
| 2014/0186592 A1 | 7/2014 | Jeon et al. | |
| 2015/0030972 A1 | 1/2015 | Jeon et al. | |

FOREIGN PATENT DOCUMENTS

| | | |
|---|---|---|
| EP | 1484370 A1 | 12/2004 |
| EP | 2266812 A2 | 12/2010 |
| JP | 2004-359715 A | 12/2004 |
| JP | 2006-008791 A | 1/2006 |
| JP | 2008-019292 A | 1/2008 |
| JP | 2009-161773 A | 7/2009 |
| JP | 2009-280672 A | 12/2009 |
| JP | 2010-013557 A | 1/2010 |
| JP | 2010-013596 A | 1/2010 |
| JP | 2011-025684 A | 2/2011 |
| JP | 2011-063635 A | 3/2011 |
| JP | 2012-188478 A | 10/2012 |
| JP | 2014-123340 A | 7/2014 |
| JP | 2014-130313 A | 7/2014 |
| KR | 10-0646475 B1 | 11/2006 |
| KR | 10-2012-0030080 A | 3/2012 |
| KR | 10-2012-0044236 A | 5/2012 |
| KR | 10-2013-0132322 A | 12/2013 |
| WO | 00/63272 A1 | 10/2000 |
| WO | 2008/090789 A1 | 7/2008 |
| WO | 2009-130993 A1 | 10/2009 |
| WO | 2014/163196 A1 | 10/2014 |

OTHER PUBLICATIONS

Xu, et al.: "Preparation and characterization of 1,4-cyclohexanedimethanol glycidyl ether by cationic type UV-curing prepolymer", Journal of Nanchang University (Natural Science), vol. 37, No. 3, Jun. 2013, pp. 239-243.

* cited by examiner

# PHOTOSENSITIVE COLORED INK COMPOSITION FOR BEZEL, BEZEL PATTERN FORMED BY USING SAME, AND DISPLAY SUBSTRATE CONTAINING SAME

TECHNICAL FIELD

This application is a National Stage Entry of International Application No. PCT/KR2015/013631, filed on Dec. 11, 2015, and claims the benefit of Korean Patent Application No. 10-2014-0178523, filed on Dec. 11, 2014 and Korean Patent Application No. 10-2015-0175947, filed on Dec. 10, 2015, all of which are hereby incorporated by reference in their entirety for all purposes as if fully set forth herein.

The present invention relates to a photosensitive color ink composition for a bezel, suitable for use in printing a bezel pattern for a display device, a method of forming a bezel pattern using the composition, a bezel pattern formed by the method, and a display panel including the bezel pattern.

BACKGROUND ART

In recent display instruments, reducing the weight and thickness thereof is regarded as important. To this end, a bezel-less display instrument having no bezel on the edge thereof has been produced. Here, a circuit line located at the edge of a substrate may be undesirably viewed from the front of the instrument, and thus a bezel pattern in a thin-film form is printed on the substrate. In order to form the bezel pattern, a photolithography process or a screen printing process may be performed. In the case of a photolithography process, the cost for forming a pattern is high and the processing is complicated. In the case of a screen printing process, it is easy to form a pattern having a film thickness of 10 μm or more due to the high viscosity of the ink composition, undesirably generating a height difference and making it difficult to form a complex and fine pattern. The use of another method is required.

Particularly, in order to realize additional slimness of instruments, a display panel and a bezel may be formed on a substrate. As shown in FIG. 1, a display pixel circuit is located on the bottom (inner surface) of the substrate and a bezel is printed on the top (outer surface) thereof. When the printed bezel is cured, the material may shrink and thus stress may remain in the bezel, thus weakening adhesion to the glass substrate. Hence, an additional film is attached to the upper surface of a bezel to protect the bezel or to perform other functions. In this case, when the adhesion between the bezel and the film is much greater than the adhesion between the bezel and the substrate, as shown in FIG. 2, stripping may be caused between the bezel and the substrate. In order to prevent such stripping, an adhesion enhancer such as a silane coupling agent may be added, but high-temperature firing is required, and thus the display is liable to be damaged. Hence, there is a need for methods of increasing adhesion between the thin-film bezel and the substrate at room temperature.

DISCLOSURE

Technical Problem

Accordingly, the present invention has been made keeping in mind the problems encountered in the related art, and the present invention is intended to provide a photosensitive color ink composition for a bezel, which enables the formation of a bezel pattern having high adhesion reliability on a substrate.

In addition, the present invention is intended to provide a method of manufacturing a bezel having high adhesion reliability on a substrate even without high-temperature processing at a temperature equal to or higher than 100° C. using the above composition.

Technical Solution

The present invention provides a photosensitive color ink composition for a bezel, comprising: (A) a cationic polymerizable alicyclic epoxy monomer, (B) a cationic polymerizable aliphatic epoxy monomer, (C) an oxetane monomer, (D) a photopolymerization initiator, and (E) a colorant.

Also, the present invention provides a method of manufacturing a bezel for a display panel, comprising forming a bezel pattern on a substrate using the above ink composition.

Also, the present invention provides a bezel pattern for a display panel, which is formed on a substrate by curing the above photosensitive color ink composition.

Also, the present invention provides a display panel including the above bezel pattern.

Advantageous Effects

According to the present invention, a photosensitive color ink composition for a bezel contains an organosilane and a glycidyl ether resin in an amount of 3 to 25%, and the resulting bezel can exhibit high adhesion to a substrate even without high-temperature firing.

According to the present invention, a bezel, formed using the photosensitive color ink composition of the invention, can exhibit high reliability, in which the bezel is not broken even under high-temperature and high-humidity conditions. Hence, the present invention can be favorably applied when a bezel pattern is exposed to the outside.

BEST MODE

Figure 1:
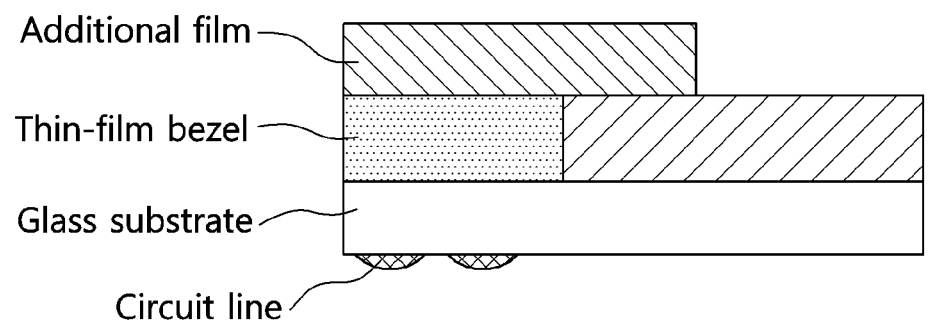
FIG. 1 schematically shows a display panel having a bezel pattern formed thereon.
Figure 2:
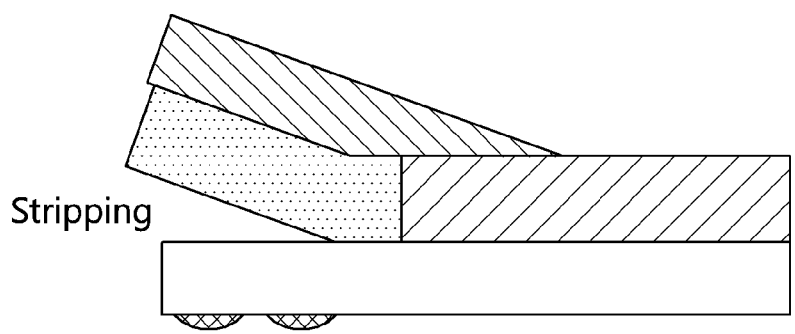
FIG. 2 schematically shows the stripping of a bezel/substrate because the strength of bezel/film adhesion is greater than that of bezel/substrate adhesion in the display panel of FIG. 1.

Hereinafter, a detailed description will be given of the present invention.

The present invention addresses a photosensitive color ink composition for a bezel, comprising (A) a cationic polymerizable alicyclic epoxy monomer, (B) a cationic polymerizable aliphatic epoxy monomer, (C) an oxetane monomer, (D) a photopolymerization initiator, and (E) a colorant.

The ink composition of the present invention includes a cationic polymerization-type resin. Since a radical polymerization-type resin has high curing shrinkage, adhesion to a substrate is low and the reaction rate is high, but curing failure may occur due to the presence of oxygen, making it unsuitable to form a bezel pattern in the thin-film form (<5 μm) required in the present invention. On the other hand, a cationic polymerization-type resin typically has low curing shrinkage, and is thus suitable for use in a thin-film-type bezel because adhesion to a substrate is high and curing failure due to the presence of oxygen does not occur.

Specifically, the ink composition of the present invention includes (A) the cationic polymerizable alicyclic epoxy monomer for the cationic polymerization-type resin. The cationic polymerizable alicyclic epoxy monomer may be any one or a mixture of two selected from among alicyclic epoxy compounds.

The alicyclic epoxy compound may have one or two epoxidized aliphatic ring groups.

For example, the epoxidized aliphatic ring group may be a compound having an epoxy group formed at the alicyclic ring. The hydrogen atom for the alicyclic ring may be optionally substituted with a substituent such as an alkyl group or the like. Examples of the alicyclic epoxy compound may include, but are not limited to, the following compounds:

dicyclopentadiene dioxide, limonene dioxide, (3,4-epoxycyclohexyl)methyl-3,4-epoxycyclohexane carboxylate, 3-vinylcyclohexene oxide, bis(2,3-epoxycyclopentyl)ether, bis(3,4-epoxycyclohexylmethyl)adipate, bis(3,4-epoxy-6-methylcyclohexylmethyl)adipate, (3,4-epoxycyclohexyl)methylalcohol, (3,4-epoxy-6-methylcyclohexyl)methyl-3,4-epoxy-6-methylcyclohexane carboxylate, ethylene glycol bis(3,4-epoxycyclohexyl)ether, 3,4-epoxycyclohexene carboxylic acid ethylene glycol diester, and (3,4-epoxycyclohexyl)ethyl trimethoxysilane.

The amount of the alicyclic epoxy monomer is preferably 10 to 40 wt %, and more preferably 10 to 30 wt %, based on the total weight of the ink composition. If the amount thereof exceeds 40 wt %, coatability may decrease. On the other hand, if the amount thereof is less than 10 wt %, sensitivity may decrease.

Also, the ink composition includes (B) the cationic polymerizable aliphatic epoxy monomer for another cationic polymerization-type resin.

The aliphatic epoxy monomer may include, but is not limited to, neopentyl glycol diglycidyl ether or 1,4-cyclohexanedimethanol diglycidyl ether.

The amount of the aliphatic epoxy monomer is preferably 3 to 25 wt %, and more preferably 10 to 20 wt %, based on the total weight of the ink composition. If the amount thereof exceeds 25 wt %, coatability may decrease. On the other hand, if the amount thereof is less than 3 wt %, sensitivity may decrease.

For example, the photosensitive color ink composition for a bezel according to the present invention contains 3 to 25% of a glycidyl ether resin, whereby the formed bezel may exhibit high adhesion to a substrate even without high-temperature firing.

Also, the ink composition includes the oxetane monomer as a cationic polymerizable monomer.

The oxetane monomer is a compound whose molecular structure includes a 4-membered cyclic ether group, and functions to decrease the viscosity of the cationic cured ink composition (for example, less than 50 cP at 25° C.).

Specific examples thereof may include 3-ethyl-3-hydroxymethyl oxetane, 1,4-bis-ethyl-3-ocetanyl)methoxy methyl]benzene, 3-ethyl-3-(phenoxymethyl)oxetane, di[(3-ethyl-3-oxetanyl)methyl]ether, 3-ethyl-3-(2-ethylhexyloxymethyl)oxetane, 3-ethyl-3-cyclohexyloxymethyl oxetane, and phenol novolac oxetane. Examples of the oxetane compound may include 「Aron oxetane OXT-101」, 「Aron oxetane OXT-121」, 「Aron oxetane OXT-211」, 「Aron oxetane OXT-221」 and 「Aron oxetane OXT-212」, available from Toagosei, which may be used alone or in a combination of two or more.

The amount of the oxetane monomer is preferably 30 to 70 wt %, and more preferably 40 to 60 wt %, based on the total weight of the ink composition. If the amount thereof exceeds 70 wt %, curability may decrease. On the other hand, if the amount thereof is less than 30 wt %, viscosity may increase and thus coatability may decrease.

The content ratio of (A) the cationic polymerizable alicyclic epoxy monomer to (C) the oxetane monomer preferably falls in the range from 1:0.5 to 1:6. If the content ratio thereof exceeds 1:6, the coatability of the composition may become superior due to the low viscosity thereof, but curing sensitivity may decrease. On the other hand, if the content ratio thereof is less than 1:0.5, the viscosity of the composition may increase, thus deteriorating the coatability of the composition.

Also, the content ratio of (A) the cationic polymerizable alicyclic epoxy monomer to (B) the cationic polymerizable aliphatic epoxy monomer preferably falls in the range from 1:0.1 to 1:2. If the content ratio thereof exceeds 1:2, the reaction rate may decrease, attributable to the low curing sensitivity. On the other hand, if the content ratio thereof is less than 1:0.1, a predetermined effect of increasing adhesion cannot be obtained.

In the ink composition, the photopolymerization initiator may be exemplified by a cationic polymerizable initiator, and is specifically a compound able to form a cation or Brönsted acid through UV irradiation, for example, at least one of an iodonium salt and a sulfonium salt.

The iodonium salt or the sulfonium salt enables a curing reaction for forming a polymer through reaction of a monomer having an unsaturated double bond contained in ink during the UV curing process, and a photosensitizer may be used depending on the polymerization efficiency.

For example, the photopolymerization initiator may include, but is not necessarily limited to, an anion such as $SbF_6^-$, $AsF_6^-$, $BF_6^-$, $(C_6F_5)_4B^-$, $PF_6^-$ or $RfnF_{6-n}^-$.

The photopolymerization initiator is preferably used in an amount of 0.5 to 15 wt %, and more preferably 5 to 10 wt %, based on the total weight of the ink composition. If the amount of the photopolymerization initiator is less than 0.5 wt %, a curing reaction is not sufficient. On the other hand, if the amount thereof exceeds 15 wt %, it is not completely dissolved, or the viscosity thereof may increase, thus deteriorating coatability.

The ink composition includes a colorant. The colorant may include at least one pigment, dye or mixture thereof, and is not particularly limited so long as it may show a desired color as needed.

In an embodiment of the present invention, a black pigment may include carbon black, graphite, a metal oxide, an organic black pigment, etc.

Examples of carbon black may include Cisto 5HIISAF-HS, Cisto KH, Cisto 3HHAF-HS, Cisto NH, Cisto 3M, Cisto 300HAF-LS, Cisto 116HMMAF-HS, Cisto 116MAF, Cisto FMFEF-HS, Cisto SOFEF, CistoVGPF, Cisto SVHSRF-HS, and Cisto SSRF (available from Donghae Carbon); Diagram Black II, Diagram Black N339, Diagram Black SH, Diagram Black H, Diagram LH, Diagram HA, Diagram SF, Diagram N550M, Diagram M, Diagram E, Diagram G, Diagram R, Diagram N760M, Diagram LR, #2700, #2600, #2400, #2350, #2300, #2200, #1000, #980, #900, MCF88, #52, #50, #47, #45, #45L, #25, # CF9, #95, #3030, #3050, MA7, MA77, MA8, MA11, MA100, MA40, OIL7B, OIL9B, OIL11B, OIL30B, and OIL31B (available from Mitsubishi Chemical); PRINTEX-U, PRINTEX-V, PRINTEX-140U, PRINTEX-140V, PRINTEX-95, PRINTEX-85, PRINTEX-75, PRINTEX-55, PRINTEX-45, PRINTEX-300, PRINTEX-35, PRINTEX-25, PRINTEX-200, PRINTEX-40, PRINTEX-30, PRINTEX-3, PRINTEX-A, SPECIAL BLACK-550, SPECIAL BLACK-350, SPECIAL BLACK-250, SPECIAL BLACK-100, and LAMP BLACK-101 (available from Degussa); RAVEN-1100ULTRA, RAVEN-1080ULTRA, RAVEN-1060ULTRA, RAVEN-1040, RAVEN-1035, RAVEN-1020, RAVEN-1000, RAVEN-890H, RAVEN-890, RAVEN-880ULTRA, RAVEN-860ULTRA, RAVEN-850, RAVEN-820, RAVEN-790ULTRA, RAVEN-780ULTRA, RAVEN-760ULTRA, RAVEN-520, RAVEN-500, RAVEN-460, RAVEN-450, RAVEN-430ULTRA, RAVEN-420, RAVEN-410, RAVEN-2500ULTRA, RAVEN-2000, RAVEN-1500, RAVEN-1255, RAVEN-1250, RAVEN-1200, RAVEN-1190ULTRA, and RAVEN-1170 (available from Columbia Carbon); and mixtures thereof.

Examples of the organic black pigment may include, but are not limited to, aniline black, lactam black, and perylene black.

In the present invention, the ink composition is cured through irradiation with long-wavelength UV light (e.g. 365 or 395 nm) and thus has a predetermined level of OD (Optical Density). To this end, the amount of the colorant is preferably 0.1 to 10 wt %, and more preferably 3 to 10 wt %, based on the total weight of the UV-curable ink composition. If the amount of the colorant is less than 0.1 wt %, OD suitable for use in a bezel is not obtained. On the other hand, if the amount thereof exceeds 10 wt %, an excess of colorant is not dispersed in ink, but may precipitate.

When the amount of the colorant falls in the above range, the OD may be maintained in the range of 0.2 to 5.

The photosensitive color ink composition according to the present invention may further include (F) an organosilane, (G) a solvent, and (H) an additive.

The ink composition of the present invention may further include (F) an organosilane as an adhesion enhancer. In order to protect a bezel or impart other functions, an additional film may be attached to the upper surface of a bezel. As such, in the case where adhesion between the bezel and the film is much greater than adhesion between the bezel and the substrate, the bezel may be stripped from the substrate. To prevent such stripping, an adhesion enhancer may be used, and may include at least one organosilane compound selected from the group consisting of an alkoxysilane-based compound, an epoxysilane-based compound, an aminophenylsilane-based compound, an aminosilane-based compound, a mercaptosilane-based compound, and a vinylsilane-based compound.

Particularly useful as the adhesion enhancer of the invention is an aminosilane-based compound or an epoxysilane-based compound.

In an embodiment of the present invention, an adhesion enhancer, that is, an epoxysilane-based compound such as 3-glycidoxypropyl trimethoxysilane (KBM-403, available from ShinEtsu), is used in order to realize superior adhesion between the bezel pattern and the substrate.

The amount of the adhesion enhancer is preferably 0.1 to 15 wt %, and more preferably 2 to 10 wt %, based on the total weight of the ink composition. If the amount thereof is less than 0.1 wt %, the bezel pattern cannot be prevented from being stripped from the substrate. On the other hand, if the amount thereof exceeds 15 wt %, the viscosity of the ink solution may increase and dispersibility may decrease.

Also, the ink composition of the present invention may further include (G) the solvent to decrease the viscosity of ink to thus increase fluidity in order to improve coatability.

The solvent may include, but is not necessarily limited to, at least one selected from the group consisting of methyl ethyl ketone, methyl cellosolve, ethyl cellosolve, ethylene glycol dimethyl ether, ethylene glycol diethyl ether, propylene glycol dimethyl ether, propylene glycol diethyl ether, diethylene glycol dimethylether, diethylene glycol diethylether, diethylene glycol methyl ethyl ether, 2-ethoxy propanol, 2-methoxy propanol, 2-ethoxy ethanol, 3-methoxy butanol, 2-butoxy ethanol, cyclohexanone, cyclopentanone, propylene glycol methyl ether acetate, propylene glycol ethyl ether acetate, 3-methoxybutyl acetate, ethyl 3-ethoxypropionate, ethyl cellosolve acetate, methyl cellosolve acetate, butyl acetate, dipropylene glycol monomethyl ether, cyclohexene oxide, and propylene carbonate.

The amount of the solvent is preferably 5 to 30 wt %, and more preferably 8 to 20 wt %, based on the total weight of the ink composition. If the amount thereof exceeds 30 wt %, the amount of the solvent that does not participate in the reaction is too high, which may thus hinder polymerization, undesirably deteriorating curing sensitivity or forming pores. On the other hand, if the amount thereof is less than 5 wt %, the amount of the diluent is not sufficient, undesirably deteriorating coatability.

Also, the ink composition of the present invention may further include (H) the additive. Specifically, at least one selected from among a surfactant and a photosensitizer for improving curability under active energy at various wavelengths may be further included.

In the present invention, the ink composition may spread within a short time after an inkjet printing process, thus exhibiting superior coating properties, and is cured and thus may manifest high adhesion properties. When the ink composition is applied, a UV lamp is preferably positioned directly after an inkjet head so as to enable curing immediately subsequent to inkjet printing.

The ink composition is cured by absorbing electromagnetic rays in the wavelength range of 360 nm to 410 nm.

The ink composition has a curing dose of 1 to 10,000 $mJ/cm^2$, and preferably 80 to 2,000 $mJ/cm^2$.

The ink composition has a viscosity of 5 to 50 cP at 25° C., and preferably 10 to 25 cP at a processing temperature, and is thus suitable for use in an inkjet printing process.

In addition, the present invention addresses a method of manufacturing a bezel on a display panel, comprising forming a bezel pattern on a substrate using the aforementioned ink composition.

Examples of the substrate may include, but are not necessarily limited to, glass, a metal, an oxide, and a polymer.

Forming the bezel pattern on the substrate may be carried out using any one process selected from among inkjet printing, gravure printing, and reverse-offset printing, in lieu of photolithography and screen printing. In particular, when an inkjet printing process is performed, it is easy to control the thickness of a thin-film bezel, and a desired pattern may be formed in a non-contact manner Hence, inkjet printing is preferably used.

The strength of adhesion between the bezel pattern and the substrate may fall in the range of 10 gf/mm to 200 gf/mm High adhesion to the substrate may be exhibited even without high-temperature firing, and high reliability, in which the bezel is not broken, may result even under conditions of high temperature and high humidity.

In the method of manufacturing the bezel according to the present invention, the ink composition is applied to a height of 1 to 20 μm, and preferably 1 to 5 μm in order to form the bezel pattern on the substrate. The applied composition is cured through exposure to light including UV light, thereby obtaining a bezel pattern in thin-film form with a thickness of 0.5 to 10 µm, and preferably 0.5 to 3.0 µm.

The light source for curing the ink composition may include, but is not necessarily limited to, a mercury vapor arc, carbon arc, Xe arc, or LED curing machine, in order to emit light at a wavelength of 250 to 450 nm. The optical density of the bezel pattern may be 0.1 to 5 for a film thickness of 2 µm, and may fall in the range of 0.5 to 2, as necessary. In this case, high shielding performance may result from the bezel pattern. If the optical density exceeds 5, the amount of the pigment that should be added is considerably increased, which may have a negative influence on ink preparation and inkjet processing. Moreover, when processing is performed, curing sensitivity may decrease.

The present invention addresses a bezel pattern for a display panel, manufactured by the above method. In the present invention, the term "bezel pattern" refers to a pattern formed on the edge of any device, such as a watch or a display device.

In addition, the present invention addresses a display panel including the bezel pattern.

The display may be used for any one selected from among a plasma display panel (PDP), a light-emitting diode (LED), an organic light-emitting diode (OLED), a liquid crystal display (LCD), a thin film transistor-liquid crystal display (TFT-LCD), and a cathode ray tube (CRT).

Mode for Invention

A better understanding of the present invention may be obtained via the following examples, which are set forth to illustrate, but are not to be construed as limiting the scope of the present invention. The scope of the present invention is given by the claims, and also contains all substitutions and modifications within the meaning and range equivalent to the claims.

EXAMPLE 1

A composition for forming a bezel pattern was prepared by mixing 5 parts by weight of a commercially available carbon black pigment, 15 parts by weight of 3,4-epoxycyclohexylmethyl-3',4-epoxycyclohexane as the photopolymerizable compounds, 10 parts by weight of neopentyl glycol diglycidyl ether, and 40 parts by weight of 3-ethyl-3-[(2-ethylhexyloxy)methyl]oxetane, 13 parts by weight of a 2-butoxyethanol as a solvent, 8 parts by weight of 4-isobutylphenyl-4'-methylphenyl iodonium hexafluorophosphate as a photopolymerization initiator, 5 parts by weight of 3-glycidoxypropyl trimethoxy silane, and an additive and stirring them for 3 hr.

EXAMPLE 2

A composition was prepared in the same manner as in Example 1, with the exception that, as the photopolymerizable compounds, 20 parts by weight of neopentyl glycol diglycidyl ether and 30 parts by weight of 3-ethyl-3-[(2-ethylhexyloxy)methyl]oxetane were used.

EXAMPLE 3

A composition was prepared in the same manner as in Example 1, with the exception that, as the photopolymerizable compounds, 5 parts by weight of neopentyl glycol diglycidyl ether and 40 parts by weight 3-ethyl-3-[(2-ethylhexyloxy)methyl]oxetane were used, and 5 parts by weight of ethylene glycol was further used.

EXAMPLE 4

A composition was prepared in the same manner as in Example 1, with the exception that, as the photopolymerizable compounds, 1,4-cyclohexanedimethanol diglycidyl ether was used in lieu of neopentyl glycol diglycidyl ether.

EXAMPLE 5

A composition was prepared in the same manner as in Example 1, with the exception that 2-butoxyethanol acetate was used as the solvent, in lieu of 2-butoxyethanol.

EXAMPLE 6

A composition was prepared in the same manner as in Example 2, with the exception that, as the photopolymerizable compounds, 35 parts by weight of 3-ethyl-3-[(2-ethylhexyloxy)methyl]oxetane was used and 3-glycidoxypropyl trimethoxy silane was not used.

EXAMPLE 7

A composition was prepared in the same manner as in Example 1, with the exception that, as the photopolymerizable compounds, 1 part by weight of neopentyl glycol diglycidyl ether and 49 parts by weight of 3-ethyl-3-[(2-ethylhexyloxy)methyl]oxetane were used.

COMPARATIVE EXAMPLE 1

A composition was prepared in the same manner as in Example 1, with the exception that, as the photopolymerizable compounds, neopentyl glycol diglycidyl ether was not used and 50 parts by weight of 3-ethyl-3-[(2-ethylhexyloxy)methyl]oxetane was used in an amount of.

COMPARATIVE EXAMPLE 2

A composition was prepared in the same manner as in Example 1, with the exception that, as the photopolymerizable compounds, propylene glycol diglycidyl ether was used in lieu of neopentyl glycol diglycidyl ether.

COMPARATIVE EXAMPLE 3

A composition was prepared in the same manner as in Example 1, with the exception that, as the photopolymerizable compounds, 40 parts by weight of neopentyl glycol diglycidyl ether and 10 parts by weight of 3-ethyl-3-[(2-ethylhexyloxy)methyl]oxetane were used.

COMPARATIVE EXAMPLE 4

A composition was prepared in the same manner as in Example 1, with the exception that 3-methacryloxypropyl trimethoxy silane was used in lieu of 3-glycidoxypropyl trimethoxy silane.

COMPARATIVE EXAMPLE 5

A composition was prepared in the same manner as in Example 1, with the exception that 3-glycidoxypropyl trimethoxy silane was not used and 50 parts by weight of 3-ethyl-3-[(2-ethylhexyloxy)methyl]oxetane.

The compositions of Examples 1 to 7 and Comparative Examples 1 to 5 are shown in Tables 1 and 2 below.

TABLE 1

|  | Unit: parts by weight | Ex. 1 | Ex. 2 | Ex. 3 | Ex. 4 | Ex. 5 | Ex. 6 | Ex. 7 |
|---|---|---|---|---|---|---|---|---|
| Colorant | Carbon black pigment | 5 | 5 | 5 | 5 | 5 | 5 | 5 |
| Alicyclic Epoxy | 3,4-epoxycyclohexylmethyl-3',4-epoxycyclohexane | 15 | 15 | 15 | 15 | 15 | 15 | 15 |
| Oxetane | 3-ethyl-3-[(2-ethylhexyloxy)methyl]oxetane | 40 | 30 | 40 | 40 | 30 | 35 | 49 |
| Aliphatic Epoxy | Neopentyl glycol diglycidyl ether | 10 | 20 | 5 |  | 20 | 20 | 1 |
|  | 1,4-cyclohexane dimethanol glycidyl ether |  |  |  | 10 |  |  |  |
| Solvent | 2-butoxyethanol | 13 | 13 | 13 | 13 | 13 | 13 | 13 |
|  | 2-butoxyethanol acetate |  |  |  |  |  |  |  |
|  | Ethylene glycol |  |  | 5 |  |  |  |  |
| Photoinitiator | 4-isobutylphenyl-4'-methylphenyl iodonium hexafluorophosphate | 8 | 8 | 8 | 8 | 8 | 8 | 8 |
| Organosilane | 3-glycidoxypropyl trimethoxy silane | 5 | 5 | 5 | 5 | 5 | — | 5 |
|  | Additive | 4 | 4 | 4 | 4 | 4 | 4 | 4 |

TABLE 2

|  | Unit: parts by weight | C. Ex. 1 | C. Ex. 2 | C. Ex. 3 | C. Ex. 4 | C. Ex. 5 |
|---|---|---|---|---|---|---|
| Colorant | Carbon black pigment | 5 | 5 | 5 | 5 | 5 |
| Alicyclic Epoxy | 3,4-epoxycyclohexylmethyl-3',4-epoxycyclohexane | 15 | 15 | 15 | 15 | 15 |
| Oxetane | 3-ethyl-3-[(2-ethylhexyloxy)methyl]oxetane | 50 | 40 | 10 | 40 | 55 |
| Aliphatic Epoxy | Neopentyl glycol diglycidyl ether | 0 |  | 40 | 10 | 0 |
|  | Propylene glycol diglycidyl ether |  | 10 |  |  |  |
| Solvent | 2-butoxyethanol | 13 | 13 | 13 | 13 | 13 |
|  | 2-butoxyethanol acetate |  |  |  |  |  |
|  | Ethylene glycol |  |  |  |  |  |
| Photoinitiator | 4-isobutylphenyl-4'-methylphenyl iodonium hexafluorophosphate | 8 | 8 | 8 | 8 | 8 |
| Organosilane | 3-glycidoxypropyl trimethoxy silane | 5 | 5 | 5 |  | — |
|  | 3-methacryloxypropyl trimethoxy silane |  |  |  | 5 | — |
|  | Additive | 4 | 4 | 4 | 4 | 4 |

<TEST EXAMPLE 1> MEASUREMENT OF VISCOSITY

The compositions of Examples 1 to 7 and Comparative Examples 1 to 5 were measured for viscosity at a rotational speed adjusted such that the rotational torque was 90% under conditions in which 0.5 ml of a sample was provided and a temperature was 25° C., using a cylindrical spindle in a Brookfield viscometer DV-II+.
  Viscosity <20 cP: ○
  Viscosity 20 to 25 cP: Δ
  Viscosity >25 cP: ×

<TEST EXAMPLE 2> MEASUREMENT OF CURING SENSITIVITY

Each composition was applied on a glass substrate using a spin-coating process and was then immediately irradiated with UV light. Here, UV light was radiated using an LED lamp having a wavelength of 395 nm (4 W/cm², Phoseon) at a dose of 1000 mJ/cm². Thereafter, an observer wearing a latex glove made an indentation by touching with the finger, and the indentation was observed, and the time required until tackiness disappeared and fingerprints were not left behind was measured to thus determine a tackiness-free time.
  Tackiness-free time <10 sec: ⊚
  Tackiness-free time <30 sec: ○
  Tackiness-free time 30 sec to 2 min: Δ
  Tackiness-free time >2 min: ×

<TEST EXAMPLE 3> MEASUREMENT OF ADHESION STRENGTH

Each composition was applied on a glass substrate using a spin-coating process and was then immediately irradiated with UV light. Thereafter, a cross-cut test (ASTM-D3359) was performed at a temporal interval of 1 min, and adhesion was evaluated based on the results of cross-cut testing at 4 min
  ASTM 3B or more: ○
  ASTM 2B to 1B: Δ
  ASTM 0B: ×

<TEST EXAMPLE 4> MEASUREMENT OF ADHESION RELIABILITY

Each of the compositions of Examples 1 to 7 and Comparative Examples 1 to 5 was applied on a cleaned LCD glass substrate to obtain a curing thickness of 2 μm using an inkjet coating process, and was then cured with UV light, to obtain a thin bezel film. A polarizing film having a width of 25 mm was attached to the thin bezel film and then defoamed in an autoclave at 60° C./5 atm for 90 sec. A 180° adhesion test was performed immediately after the defoaming process and after a lapse of three days under high-temperature/high-humidity conditions of 60° C./90%, so that adhesion between the bezel and the substrate was indirectly evaluated based on peel strength when the polarizing film was stripped from the bezel. Typically, the peel strength between the polarizing film and the bezel was 900 to 1000 gf on the same day and was 1800 to 2000 gf after three days. If there was no stripping between the bezel and the substrate during the stripping of the polarizing film from the bezel, the peel strength between the bezel and the substrate was evaluated to be greater than the peel strength between the polarizing film and the bezel.

no stripping of bezel/substrate after 7 days: ◎
no stripping of bezel/substrate after 3 days: ○
no stripping of bezel/substrate on the same day but stripping after 3 days: Δ
stripping of bezel/substrate on the same day: ×

The test results measured in the above Test Examples are shown in Tables 3 and 4 below.

TABLE 3

|  | Ex. 1 | Ex. 2 | Ex. 3 | Ex. 4 | Ex. 5 | Ex. 6 | Ex. 7 |
|---|---|---|---|---|---|---|---|
| Viscosity | ○ | ○ | ○ | ○ | ○ | ○ | ○ |
| Curing sensitivity | ○ | Δ | ○ | ○ | ○ | Δ | ○ |
| Adhesion | ○ | ○ | ○ | ○ | ○ | Δ | ○ |
| Adhesion reliability | ○ | ◎ | ○ | ○ | ○ | ○ | Δ |

TABLE 4

|  | C. Ex. 1 | C. Ex. 2 | C. Ex. 3 | C. Ex. 4 | C. Ex. 5 |
|---|---|---|---|---|---|
| Viscosity | ○ | Δ | Δ | ○ | ○ |
| Curing sensitivity | ○ | Δ | X | ○ | ○ |
| Adhesion | Δ | X | — | X | X |
| Adhesion reliability | Δ | — | — | — | X |

All the ink compositions of Examples 1 to 7 were curable ink compositions comprising an alicyclic epoxy compound, an aliphatic epoxy monomer, an oxetane monomer and a photopolymerization initiator, thus obtaining thin films having superior viscosity, sensitivity, adhesion and adhesion reliability.

In particular, the ink composition of Example 2 comprising a relatively large amount, 20% of the aliphatic epoxy monomer exhibited decreased curing sensitivity but excellent adhesion reliability.

Example 6, containing no organosilane compound, exhibited slightly lower adhesion reliability than Example 2, having a composition similar thereto.

In Example 7, the amount of the aliphatic epoxy monomer was 1%, lower than 3%, and moreover, the ratio of the alicyclic epoxy to the aliphatic epoxy was less than 1:0.1, whereby adhesion reliability was found to be low compared to other Examples.

In the ink composition of Comparative Example 1, containing only the alicyclic epoxy monomer without an aliphatic epoxy monomer, curing sensitivity was equal to that of Example 1. However, since the alicyclic epoxy monomer and the aliphatic epoxy monomer were not used together, a polymerization reaction occurred relatively quickly, whereby the epoxy chain was not grown sufficiently long in a long period of time, resulting in a short epoxy chain, and cross-linking did not occur between the other polymers, undesirably deteriorating adhesion strength and adhesion reliability.

In the ink composition of Comparative Example 2, due to the high viscosity of propylene glycol diglycidyl ether itself, the fluidity of the composition is low and the movement of active species is slow and curing sensitivity is low, and moreover, the inside of the thin film cannot not completely cured in a predetermined processing time, resulting in very poor adhesion strength.

The ink composition of Comparative Example 3 comprising 40% of neopentyl glycol diglycidyl ether, exhibited high viscosity, and sufficient curing sensitivity could not be obtained due to the insufficient amount of oxetane compound. Furthermore, since it was not cured within a predetermined period of time, adhesion strength and adhesion reliability could not be measured.

In the ink composition of Comparative Example 4 containing, as the organosilane, methacryloxy silane, particularly 3-methacryloxypropyl trimethoxy silane, sufficient adhesion could not be obtained.

In the ink composition of Comparative Example 5, containing no organosilane compound, adhesion strength and adhesion reliability were much lower than those of Comparative Example 1 having a composition similar thereto.

The invention claimed is:

1. A photosensitive color ink composition for a bezel, comprising: (A) a cationic polymerizable alicyclic epoxy monomer; (B) a cationic polymerizable aliphatic epoxy monomer; (C) an oxetane monomer; (D) a photopolymerization initiator; (E) a colorant, and (F) an organosilane, and having a viscosity of 5 cP to 20 cP at 25° C.,
   wherein (A) the cationic polymerizable alicyclic epoxy monomer is 3,4-epoxycyclohexylmethyl-3',4-epoxycyclohexane carboxylate,
   wherein (B) the cationic polymerizable aliphatic epoxy monomer is neopentyl glycol diglycidyl ether or 1,4-cyclohexanedimethanol diglycidyl ether,
   wherein (C) the oxetane monomer is 3-ethyl-3-[(2-ethylhexyloxy)methyl]oxetane,
   wherein (F) the organosilane is 3-glycidoxypropyl trimethoxy silane,
   wherein (A) the cationic polymerizable alicyclic epoxy monomer is present in an amount of 15 wt %, based on the total weight of the ink composition,
   wherein (B) the cationic polymerizable aliphatic epoxy monomer is present in an amount of 5 to 20 wt %, based on the total weight of the ink composition,
   wherein (C) the oxetane monomer is present in an amount of 30 to 49 wt %, based on the total weight of the ink composition,
   wherein a content ratio of (A) the cationic polymerizable alicyclic epoxy monomer to (C) the oxetane monomer ranges from 1:2 to 1:3.3, and
   wherein a content ratio of (A) the cationic polymerizable alicyclic epoxy monomer to (B) the cationic polymerizable aliphatic epoxy monomer ranges from 1:0.3 to 1:1.3.

2. The photosensitive color ink composition of claim 1, further comprising (G) a solvent; and (H) an additive.

3. The photosensitive color ink composition of claim 1, wherein (D) the photopolymerization initiator is at least one selected from among an iodonium salt and a sulfonium salt.

4. The photosensitive color ink composition of claim 2, wherein (H) the additive is at least one selected from among a surfactant and a photosensitizer.

5. The photosensitive color ink composition of claim 1, wherein the ink composition has a curing dose of 1 to 10,000 mJ/cm$^2$.

6. A method of manufacturing a bezel for a display panel, comprising forming a bezel pattern on a substrate using the ink composition of claim 1.

7. The method of claim 6, wherein the bezel pattern is formed on the substrate using any one process selected from among an inkjet printing process, a gravure printing process and a reverse-offset printing process.

8. The method of claim 6, wherein a strength of adhesion between the bezel pattern and the substrate ranges from 10 gf/mm to 200 gf/mm.

9. A bezel pattern for a display panel, formed on a substrate by curing the photosensitive color ink composition of claim 1.

10. The bezel pattern of claim 9, wherein a strength of adhesion between the bezel pattern and the substrate ranges from 10 gf/mm to 200 gf/mm.

11. The bezel pattern of claim 9, wherein the bezel pattern has a thickness of 0.5 to 10 µm.

12. The bezel pattern of claim 9, wherein the bezel pattern has an optical density of 0.1 to 5 for a film thickness of 2.0 µm.

13. A display panel, comprising the bezel pattern of claim 9.

\* \* \* \* \*